(12) United States Patent
Ha

(10) Patent No.: US 6,420,929 B1
(45) Date of Patent: Jul. 16, 2002

(54) N WAY CANCELLATION COUPLER FOR POWER AMPLIFIER

(76) Inventor: Thomas Ha, 6470 Frampton Cir., Huntington Beach, CA (US) 92648

( * ) Notice: Subject to any disclaimer, the term of this patent is extended or adjusted under 35 U.S.C. 154(b) by 6 days.

(21) Appl. No.: 09/682,348

(22) Filed: Aug. 23, 2001

(51) Int. Cl.[7] ................................................ H03F 1/00
(52) U.S. Cl. ..................................................... 330/151
(58) Field of Search .......................... 330/151; 333/100, 333/124, 125, 136

(56) References Cited

U.S. PATENT DOCUMENTS

| | | | |
|---|---|---|---|
| 1,686,792 A | 2/1925 | Black | |
| 3,922,617 A | 11/1975 | Denniston et al. | 330/149 |
| 3,993,961 A | 11/1976 | Narayanan | 330/149 |
| 4,629,996 A * | 12/1986 | Watanable et al. | 330/151 |
| 4,885,551 A | 12/1989 | Myer | 330/52 |
| 5,023,565 A | 6/1991 | Lieu | 330/151 |
| 5,043,673 A | 8/1991 | Suematsu et al. | 330/149 |
| 5,155,448 A * | 10/1992 | Powell | 330/151 |
| 5,323,119 A | 6/1994 | Powell et al. | 330/151 |
| 5,412,342 A | 5/1995 | Sakamoto et al. | 330/149 |
| 5,528,196 A | 6/1996 | Baskin et al. | 330/151 |
| 5,610,554 A | 3/1997 | Anvari | 330/52 |
| 5,644,268 A | 7/1997 | Hang | 330/151 |
| 5,789,976 A * | 8/1998 | Ghannouchi et al. | 330/151 |
| 5,917,375 A * | 6/1999 | Lisco et al. | 330/151 |
| 5,969,572 A | 10/1999 | Jeong et al. | 330/149 |
| 6,037,837 A * | 3/2000 | Miyaji et al. | 330/151 |
| 6,046,635 A | 4/2000 | Gentzler | 330/149 |
| 6,087,898 A | 7/2000 | Baskin | 330/151 |
| 6,133,791 A | 10/2000 | Horiguchi et al. | 330/151 |
| 6,144,255 A | 11/2000 | Patel et al. | 330/151 |
| 6,166,600 A | 12/2000 | Myer | 330/151 |
| 6,166,601 A | 12/2000 | Shalom et al. | 330/151 |
| 6,208,204 B1 | 3/2001 | Suzuki et al. | 330/52 |

* cited by examiner

*Primary Examiner*—Robert Pascal
*Assistant Examiner*—Khanh Van Nguyen
(74) *Attorney, Agent, or Firm*—Sheldon & Mak; Robert J. Rose

(57) ABSTRACT

An N way carrier cancellation coupler (160), N being greater than 1, for use in a feed forward power amplifier (6), comprising a first N way divider (162), a second N way divider (166), an N way combiner (168), N carrier cancellation couplers (164), the inputs of each of the N carrier cancellation couplers (164) connected to the first N way divider (162) and the second N way divider (166), and the output of each of the N carrier cancellation couplers connected to the N way combiner (168). An M way distortion cancellation coupler (180) is also provided, as well as a feed forward power amplifier comprising a feed forward power amplifier having a first loop and a second loop, an N way carrier cancellation coupler (160), or an M way distortion cancellation coupler (180), or both.

10 Claims, 5 Drawing Sheets

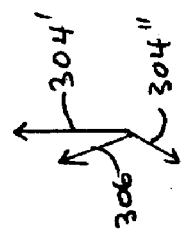
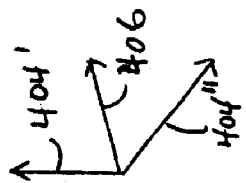
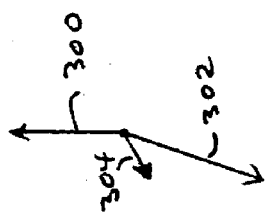
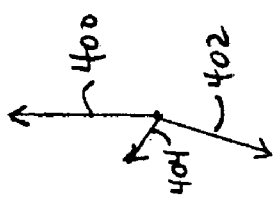
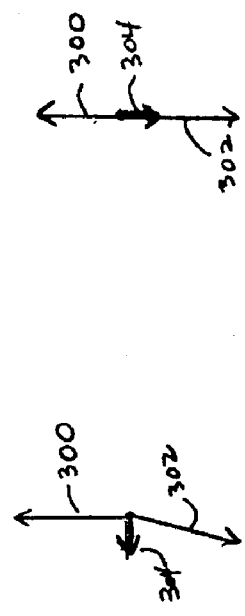
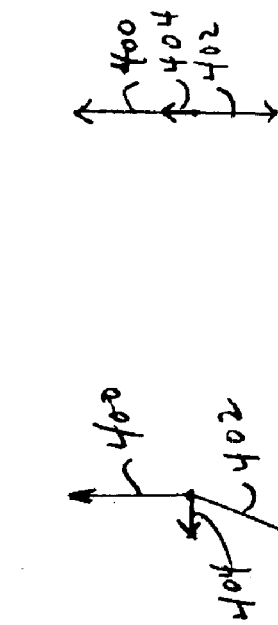

N WAY CANCELLATION COUPLER FOR POWER AMPLIFIER

BACKGROUND OF INVENTION

The present invention relates generally to a feed forward power amplifier, and specifically to improvements in distortion cancellation and improvements in carrier cancellation and efficiency.

To provide high quality voice communication and handle more calls, telecommunication operators use digital modulation technology and multi-channel carriers. Examples of such technologies include CDMA, TDMA, w-CDMA, and EDGE-GSM. A linear power amplifier is needed to transmit digital/multi-carrier waveforms without adding noise, distortions, and adjacent channel interference. Typical RF power amplifiers used for a base station generate −30 dBc distortion levels. A digital/multi-carrier system, however, requires a power amplifier with −45 dBc for CDMA, −60 dBc for TDMA, and −70 dBc for GSM.

Several linearization techniques have been used to linearize or improve the traditional class AB power amplifier distortion performance. Such techniques include RF feedback, Cartesian feedback, analog pre-distortion, digital pre-distortion and feed forward. The RF feedback and Cartesian feedback techniques improve inter-modulation distortion ("IMD") by 10 db but both techniques are only useful for narrowband. Analog pre-distortion improves IMD up to 8–9 db but is not stable over certain temperatures. Digital pre-distortion uses lookup table A/D and D/A converters to distort the input signal. This technique requires very fast A/D and D/A converters. Successful results have not been reported for work involving this technique.

The feed forward technique improves IMD by almost 30 db with reasonable bandwidth. The feed forward technique is widely recognized and is used by several power amplifier companies. This technique was disclosed in 1930 by H. Black, U.S. Pat. No. 1,686,792. The feed forward technique involves splitting an input signal into two paths, which process along two loops, the first loop producing a distortion component by combining an out of phase signal segment with an amplified signal containing distortion, and the second loop removing the distortion from the amplified signal by using an out of phase distortion component.

Improvements have been disclosed to the feed forward system. Improvements to the first loop have included adding control circuitry to monitor the carrier residue and adjust the gain and phase accordingly to minimize the carrier residue. Improvements to the second loop have included pilot tone injection at the input of a main amplifier which behaves as a distortion. So far, most improvements only aim to solve loop stability. The feed forward amplifier in the existing marketplace, however, does not meet the stringent Global System for Mobile communications ("GSM") requirements. A dual loop feed forward may meet the GSM requirements, but this approach is very costly and has low efficiency due to using two error amplifiers and two output delay lines. Several power amplifier manufacturers have abandoned this approach.

U.S. Pat. No. 5,412,342 to Sakamoto, et al., for "Power Amplifier Device Comprising a Plurality of Feedforward Distortion Compensating Circuits in Parallel," discloses using random phase cancellation in parallel feed-forward circuits, and more particularly, discloses a power amplifier device comprising a feed forward distortion compensating circuit comprising N complete feed forward circuits (N being an integer not less than two) that are connected in parallel and are supplied with input radio frequency signals through an N-divider. Component outputs of the feed forward circuits are combined in phase as the output signal by an N-combiner.

The use of N complete feed-forward amplifier circuits, however, is costly. Sakamoto does not disclose random phase cancellation within a stage of a single feed-forward circuit, which would be a less costly alternative.

U.S. Pat. No. 6,037,837 to Miyaji, et al., for "Feed Forward Amplifier" discloses a feed forward power amplifier which cancels distortion by dividing an input signal into two divided signals and employs a vector adjuster to adjust the phase of the distortion components. The use of N power amplifiers connected in parallel coupled with a vector adjuster, is disclosed, but random phase cancellation within a stage of a single feed-forward circuit is not disclosed. The need to employ N power amplifiers and vector adjuster circuitry makes this approach more costly than random phase cancellation within a stage of a single feed-forward circuit.

What is needed is a cost efficient feed forward power amplifier to transmit digital/multi-carrier waveforms with minimum distortion, preferably using random phase cancellation within a stage of a single feed-forward circuit.

SUMMARY OF INVENTION

The present invention meets this need by providing a cost efficient feed forward power amplifier for transmitting digital/multi-carrier waveforms with minimum distortion, using random phase cancellation within a stage of a single feed-forward circuit.

An N way carrier cancellation coupler is provided, N being greater than 1, for use in a feed forward power amplifier, comprising a first N way divider, having an input and N outputs, a second N way divider, having an input and N outputs, an N way combiner having N inputs and an output, N carrier cancellation couplers, each having a first input, a second input and an output, the first input of each of the N carrier cancellation couplers connected to one of the N outputs of the first N way divider, the second input of each of the N carrier cancellation couplers connected to one of the N outputs of the second N way divider, and the output of each of the N carrier cancellation couplers connected to one of the N inputs of the N way combiner.

An M way distortion cancellation coupler is also provided, M being greater than 1, for use in a feed forward power amplifier, comprising a first M way divider, having an input and M outputs, a second M way divider, having an input and M outputs, an M way combiner having M inputs and an output, M distortion cancellation couplers, each having a first input, a second input and an output, the first input of each of the M distortion cancellation couplers connected to one of the M outputs of the first M way divider, the second input of each of the M distortion cancellation couplers connected to one of the M outputs of the second M way divider, and the output of each of the M distortion cancellation couplers connected to one of the M inputs of the M way combiner.

An N way carrier cancellation coupler is described for use in the first loop stage of a feed forward power amplifier, comprising first divider means for dividing a signal N ways and outputting N divided signals, second divider means for dividing a delayed signal N ways and outputting N delayed signals, N carrier cancellation coupler means, each for receiving one of the N divided signals from the first divider means, and one of the N delayed signals from the second divider means, and producing one of N error signals from a coupled form of the received one of the N divided signals and received one of the N delayed signals; and signal combiner means for receiving each one of the N error signals from the N carrier cancellation coupler means and producing a combined error signal from a combined form of the N error signals.

An M way distortion cancellation coupler is described for use in the second loop stage of a feed forward power amplifier, comprising first divider means for dividing an amplified error signal M ways and outputting M divided error signals, second divider means for dividing a delayed signal with distortion M ways and outputting M divided signals, M distortion cancellation coupler means, each for receiving one of the M divided error signals from the first divider means, and one of the M divided signals from the second divider means, and producing one of M main signals from a coupled form of the received one of the M divided error signals and received one of the M divided signals; and signal combiner means for receiving each of the M main signals from each of the M distortion cancellation coupler means and producing an output signal from a combined form of the M main signals.

A method is described for reducing the carrier component of a signal in the first loop stage of a feed forward power amplifier, comprising the steps of (a) dividing the signal N ways, N being greater than 1, to produce N divided signals, (b) dividing a delayed form of the signal N ways to produce N delayed signals, (c) coupling one of the N divided signals and one of the N delayed signals to produce one of N error signals; (d) repeating step (c) until each one of the N divided signals has been coupled with one of the N delayed signals to produce one of N error signals; and (e) combining each of the N error signals to produce a combined error signal from a combined form of the N error signals.

A method for reducing the distortion component of a signal in the second loop stage of a feed forward power amplifier is also described comprising the steps of (a) dividing the distortion component of the signal M ways, M being greater than 1, to produce M divided error signals, (b) dividing a delayed form of the signal M ways to produce M divided signals, (c) coupling one of the M divided error signals and one of the M divided signals to produce one of M main signals; (d) repeating step (c) until each one of the M divided error signals has been coupled with one of the M divided signals to produce one of M main signals; and (e) combining each of the M main signals to produce an output signal from a combined form of the M main signals.

In another embodiment either of the methods so described further comprise the step of selecting the components used in coupling step (c) to complement one another during manufacture.

A power amplifier using the invention is described comprising a feed forward power amplifier having a first loop and a second loop; and an N way carrier cancellation coupler, N being greater than 1, having a first input, a second input, and an output, both the first input and second input connected to the first loop of the feed forward power amplifier, and the output connected to the second loop of the feed forward power amplifier.

The power amplifier with an N way carrier cancellation coupler may further comprise an M way distortion cancellation coupler, M being greater than 1, having a first input, a second input, and an output, both the first input and second input connected to the second loop of the feed forward power amplifier.

In another embodiment the power amplifier comprises a feed forward power amplifier having a first loop and a second loop; and an M way distortion cancellation coupler, M being greater than 1, having a first input, a second input, and an output, both the first input and second input connected to the second loop of the feed forward power amplifier.

In one embodiment of the invention a feed forward power amplifier is described comprising an input coupler for receiving an input signal and dividing it in to a main signal and a first signal; a main amplifier connected to the input coupler for receiving the main signal and outputting a distorted amplified signal; a first delay circuit connected to the input coupler for receiving the first signal and outputting a first delayed signal; a sample coupler connected to the main amplifier for receiving the distorted amplified signal and dividing it into a first divided signal and a second divided signal; an attenuator connected to the sample coupler for receiving the second divided signal and outputting an attenuated signal with distortion; an N way carrier cancellation circuit connected to the attenuator for receiving the attenuated signal with distortion and the first delay circuit for receiving the first delayed signal, and outputting a combined error signal; an error amplifier connected to the N way carrier cancellation circuit for receiving the combined error signal and outputting an amplified error signal; a second delay circuit connected to the sample coupler for receiving the first divided signal and outputting a delayed signal with distortion; and an M way distortion cancellation circuit connected to the second delay circuit for receiving the delayed signal with distortion and the error amplifier for receiving the amplified error signal, and outputting the output signal; wherein either N is greater than 1 and M is 1, N is 1 and M is greater than 1, or N is greater than 1 and M is greater than 1.

In such embodiment either the N way carrier cancellation circuit, or the M way distortion cancellation circuit, or both the N way carrier cancellation circuit and the M way distortion cancellation circuit, comprises a plurality of cancellation couplers, two signal dividers and a signal combiner, the input of each of the plurality of cancellation couplers connected in parallel to each of the signal dividers, and the output of each of the plurality of cancellation couplers connected to the signal combiner.

A feed forward power amplifier with reduced distortion in an output signal having a first loop stage and a second loop stage is therefore described, wherein the reduction of carrier residue in the first loop stage, or the reduction of distortion in the second loop stage comprises random phase cancellation.

A feed forward power amplifier for reducing distortion in an output signal is disclosed comprising means for receiving an input signal and dividing it into a main signal and a first signal; means for amplifying the main signal and outputting a distorted amplified signal; means for processing the first signal to produce a first delayed signal; means for dividing the distorted amplified signal into a first divided signal and a second divided signal; means for attenuating the second divided signal to produce an attenuated signal with distortion; means for splitting N ways both the attenuated signal with distortion and the first delayed signal and combining the split signals into a combined error signal; means for amplifying the combined error signal to produce an amplified error signal; means for processing the first divided signal to produce a delayed signal with distortion; and means for splitting M ways both the delayed signal with distortion and the amplified error signal and combining to produce the output signal; wherein either N is greater than 1 and M is 1, N is 1 and M is greater than 1, or N is greater than 1 and M is greater than 1.

A method for reducing distortion in an output signal from a feed forward power amplifier is disclosed comprising the steps of receiving an input signal and dividing it into a main signal and a first signal; amplifying the main signal and outputting a distorted amplified signal; processing the first signal to produce a first delayed signal; dividing the distorted amplified signal into a first divided signal and a second divided signal; attenuating the second divided signal to produce an attenuated signal with distortion; splitting N ways both the attenuated signal with distortion and the first delayed signal and combining the split signals into a combined error signal; amplifying the combined error signal to produce an amplified error signal; processing the first divided signal to produce a delayed signal with distortion; and splitting M ways both the delayed signal with distortion and the amplified error signal and combining to produce an output signal; wherein either N is greater than 1 and M is 1, N is 1 and M is greater than 1, or N is greater than 1 and M is greater than 1.

In a preferred embodiment, the method so disclosed further comprises the step of selecting the components used in splitting N ways or splitting M ways to complement one another during manufacture.

BRIEF DESCRIPTION OF DRAWINGS

These and other features, aspects and advantages of the present invention will become better understood from the following description, appended claims, and accompanying drawings where:

FIG. 5 is a pictorial representation of the addition of two equal amplitude vectors representing the power and phase of the signals combined at the N way combiner of FIG. 2.

FIG. 6 is a pictorial representation of the addition of two vectors 180% out of phase representing the power and phase of the signals combined at the N way combiner of FIG. 2.

FIG. 7 is a pictorial representation of the addition of vectors representing the power and phase of the signals combined at the N way combiner of FIG. 2.

FIG. 8 is a pictorial representation of the addition of two equal amplitude vectors representing the power and phase of the signals combined at the M way combiner of FIG. 3.

FIG. 9 is a pictorial representation of the addition of two vectors 180% out of phase representing the power and phase of the signals combined at the M way combiner of FIG. 3.

FIG. 10 is a pictorial representation of the addition of vectors representing the power and phase of the signals combined at the M way combiner of FIG. 3.

FIG. 11 is a pictorial representation of the addition of residue vectors representing the power and phase of the residue signals resulting from the addition of the vectors of FIG. 7.

FIG. 12 is a pictorial representation of the addition of residue vectors representing the power and phase of the residue signals resulting from the addition of the vectors of FIG. 10.

DETAILED DESCRIPTION

Figure 1:
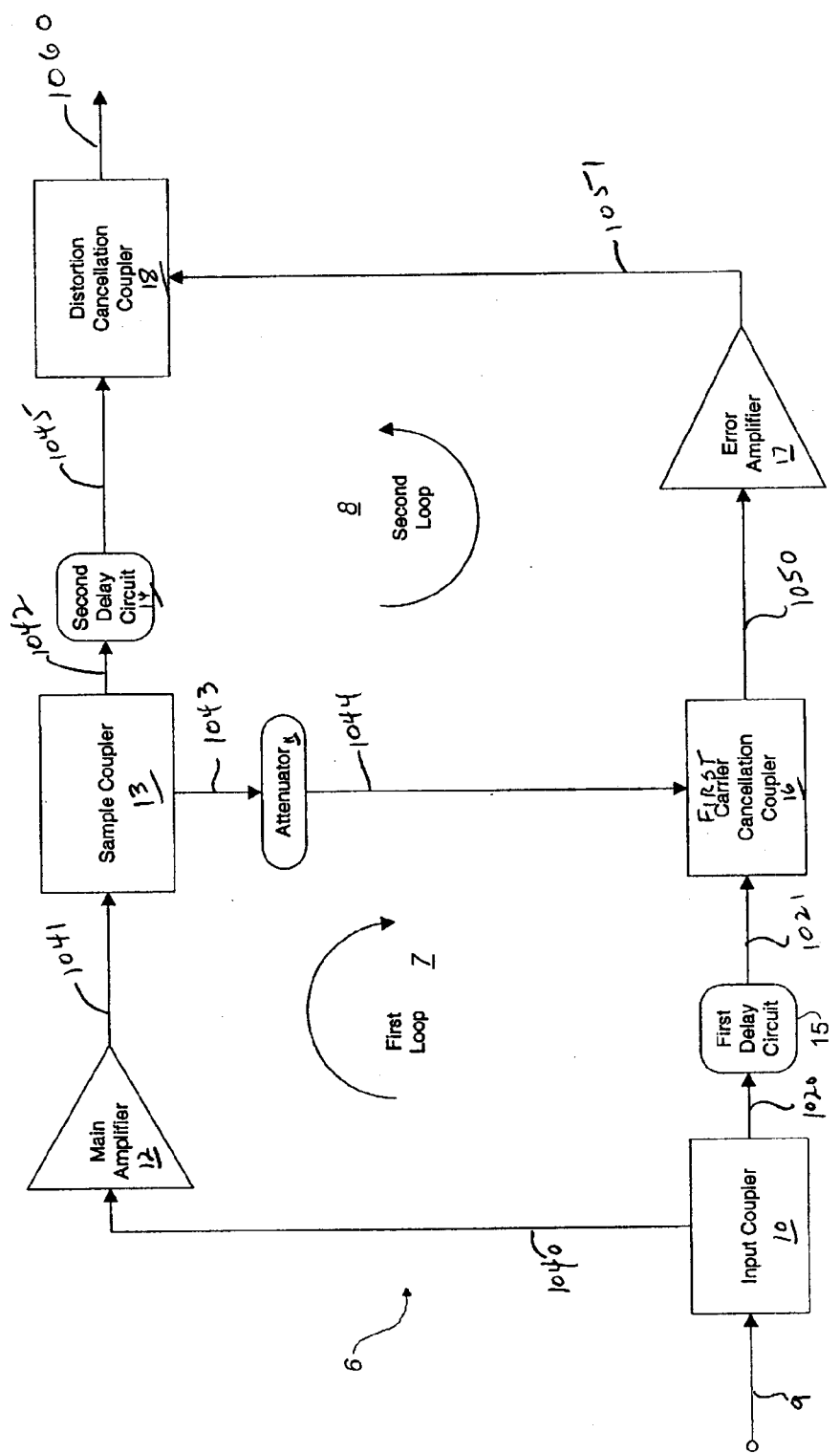
FIG. 1 is a flow diagram of a feed forward power amplifier circuit.

The basic feed forward power amplifier circuit 6 as is well known in the art is shown in FIG. 1. An input signal 9 is divided by an input coupler 10 into a first signal 1020 and a main signal 1040. The first signal 1020 goes through a first delay circuit 15 yielding a phase shifted first delayed signal 1021 which then goes to a first carrier cancellation coupler 16. The main signal 1040 goes through a main amplifier 12, producing a distorted amplified signal 1041. The distorted amplified signal 1041 is divided into a first divided signal 1042 and a second divided signal 1043 by a 30 db sample coupler 13. First divided signal 1042 is sent through a second delay circuit 14 yielding a phase shifted delayed signal with distortion 1045 comprising a first carrier component (not shown) and a first distortion component (not shown). Delayed signal with distortion 1045 is injected into a first distortion cancellation coupler 18. Second divided signal 1043 goes through an attenuator 11 yielding an attenuated signal with distortion 1044 comprising a second carrier component (not shown) and a second distortion component (not shown). Attenuated signal with distortion 1044 is then injected into the first carrier cancellation coupler 16. The first delayed signal 1021 output from the first delay circuit 15 combines in the first carrier cancellation coupler 16 with the attenuated signal with distortion 1044.

With reference to FIG. 5, FIG. 6, and FIG. 7, first delayed signal 1021 can be represented by first vector 300 and the second carrier component of attenuated signal with distortion 1044 can be represented by second vector 302, each graphically representing phase and amplitude, as is well known in the art.

FIG. 5 illustrates the case of the addition of first vector 300 and second vector 302, the vectors being of equal amplitude and approximately 180 degrees out of phase, to yield a first carrier residue vector 304 which represents the amplitude and phase of a carrier residue remaining after first delayed signal 1021 is combined with the attenuated signal with distortion 1044.

Similarly, FIG. 6 illustrates the case of the addition of first vector 300 and second vector 302, the vectors now being of approximately equal amplitude and 180 degrees out of phase, to yield first carrier residue vector 304.

Finally, FIG. 7 illustrates the case of the addition of first vector 300 and second vector 302, the vectors being of approximately equal amplitude and approximately 180 degrees out of phase, to yield first carrier residue vector 304.

In each of the three possible cases, depending upon the amplitude and phase of the vectors representing first delayed signal 1021 and the second carrier component of attenuated signal with distortion 1044, it will be evident to those skilled in the art that a first carrier residue vector 304 of some amplitude and phase must be generated. It will also be evident that the closer in amplitude the vectors become, and. the closer to 180 degrees they are out of phase, the smaller in magnitude will be the first carrier residue vector 304. In other words, the smaller in magnitude of first carrier residue vector 304, the more the second carrier component of attenuated signal with distortion 1044 will have been cancelled, leaving only the second distortion component of attenuated signal with distortion 1044, and resulting in a first error signal 1050 output from the first carrier cancellation coupler 16 with minimal first carrier residue vector 304.

First error signal 1050 output from first carrier cancellation coupler 16 is sent to an error amplifier 17 yielding first amplified error signal 1051. First amplified error signal 1051 combines in the first distortion cancellation coupler 18 with delayed signal with distortion 1045.

With reference to FIG. 8, FIG. 9, and FIG. 10, first amplified error signal 1051 can be represented by third vector 400, and the first distortion component of delayed signal with distortion 1045 can be represented by fourth vector 402, each graphically representing phase and amplitude, as is well known in the art.

FIG. 8 illustrates the case of the addition of third vector 400 and fourth vector 402, the vectors being of equal amplitude and approximately 180 degrees out of phase, to yield first distortion residue vector 404 which represents the amplitude and phase of a distortion residue remaining after first amplified error signal 1051 combines in the first distortion cancellation coupler 18 with the delayed signal with distortion 1045.

Similarly, FIG. 9 illustrates the case of the addition of third vector 400 and fourth vector 302, the vectors being of approximately equal amplitude and 180 degrees out of phase, to yield first distortion residue vector 404.

Finally, FIG. 10 illustrates the case of the addition of third vector 400 and fourth vector 402, the vectors being of approximately equal amplitude and approximately 180 degrees out of phase, to yield first distortion residue vector 404.

In each of the three possible cases, depending upon the amplitude and phase of the vectors representing first amplified error signal 1051 and the first distortion component of delayed signal with distortion 1045, it will be evident to those skilled in the art that a first distortion residue vector 404 of some amplitude and phase must be generated. It will also be evident that the closer in amplitude the vectors become, and the closer to 180 degrees they are out of phase, the smaller will be the first distortion residue vector 404. In other words, the smaller the distortion residue vector, the more the distortion will have been cancelled, leaving substantially only the first carrier component of delayed signal with distortion 1045, resulting in an first output signal 1060 output from the first distortion cancellation coupler 18 with minimal distortion.

The distortion levels resulting from main amplifier 12 are about 40 db down with reference to the main signal 1040, making the first carrier component about 10 db higher than the first distortion component. The error amplifier 17 was designed to amplify distortions without adding any additional distortions, but in actual practice, the error amplifier 17 also amplifies any carrier residue in first amplified error signal 1051. The peak power of the error amplifier 17 must be 10 db higher than actually necessary to account for the amplification of such carrier residues. Power transistors, which will consume more DC power, are typically added to the error amplifier 17 for increased power.

N Way Carrier Cancellation

In one embodiment of the invention, first carrier cancellation coupler 16 is replaced with an N way carrier cancellation circuit 160, comprising a plurality of cancellation couplers, two signal dividers and a signal combiner, wherein the input of each cancellation coupler is connected in parallel to each of the signal dividers, the output of each cancellation coupler is connected to the signal combiner, and the reduction of carrier residue is accomplished by random phase cancellation. Additional components could be added to N way carrier cancellation circuit 160 without deviating from the present invention, so long as the reduction of carrier residue is accomplished by random phase cancellation.

Figure 2:
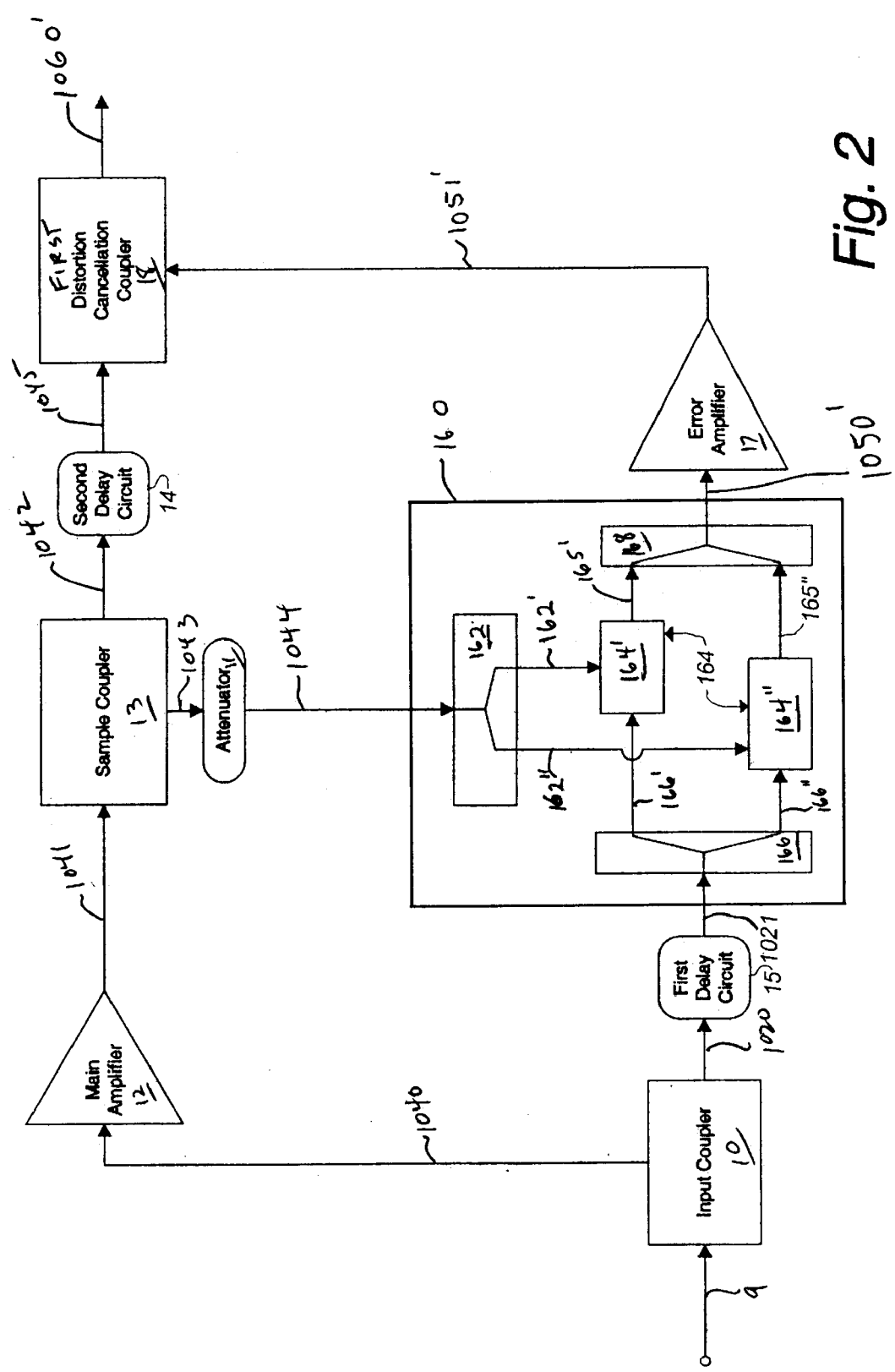
FIG. 2 is a flow diagram of the feed forward power amplifier circuit of FIG. 1 with N way random phase cancellation within the First Loop stage according to the present invention.

With reference to FIG. 2, in a first embodiment in which N is 2, attenuated signal with distortion 1044 enters N way carrier cancellation circuit 160 and is received into a first N way divider 162 which divides attenuated signal with distortion 1044 into a third divided signal 162' having a third carrier component (not shown) and a third distortion component (not shown), which third divided signal 162' is injected into a second carrier cancellation coupler 164' and, a fourth divided signal 162", having a fourth carrier component (not shown) and a fourth distortion component (not shown), which fourth divided signal 162" is injected into a third carrier cancellation coupler 164".

First delayed signal 1021 enters N way carrier cancellation circuit 160 and is received into a second N way divider 166 which divides first delayed signal 1021 into a second delayed signal 166' which is injected into the second carrier cancellation coupler 164' and a third delayed signal 166" which is injected into the third carrier cancellation coupler 164".

Second delayed signal 166' combines with the third divided signal 162' in the second carrier cancellation coupler 164', which outputs second error signal 165' having a distortion component (not shown) and a carrier residue component which may be represented by second carrier residue vector 304', and third delayed signal 166" combines with the third divided signal 162" in the third carrier cancellation coupler 164", which outputs third error signal 165" having a distortion component (not shown) and a carrier residue component which may be represented by third carrier residue vector 304".

In similar fashion to the description given above, second delayed signal 166' and the third carrier component of the third divided signal 162' are approximately 180 degrees out of phase and of approximately equal amplitude, thereby substantially canceling each other, yet resulting in a carrier residue component represented by second carrier residue vector 304' of some magnitude and phase.

Likewise, third delayed signal 166" and the carrier component of the fourth divided signal 162" are approximately 180 degrees out of phase and of approximately equal amplitude, thereby substantially canceling each other, but yet again resulting in a carrier residue component represented by third carrier residue vector 304" of some magnitude and phase.

As described above with reference to vectors, it will be evident to those skilled in the art that the closer in amplitude and the closer to 180 degrees out of phase that second delayed signal 166' and the carrier component of the third divided signal 162' are, the smaller will be the carrier residue represented by second carrier residue vector 304'. The same holds for third delayed signal 166" and the carrier component of the third divided signal 162". In other words, the smaller are second carrier residue vector 304' and third carrier residue vector 304", the more the carrier will have been cancelled from second error signal 165' and third error signal 165".

Second error signal 165' and third error signal 165" are both input to N way combiner 168, where they are coupled into combined error signal 1050'.

The amount of the carrier residue that remains in the second error signal 165' and third error signal 165" will depend upon the physical component characteristics of the individual carrier cancellation couplers, as will be evident to those skilled in the art. The phase and amplitude of the second carrier residue vector 304' and the third carrier residue vector 304" will therefore be independent, and effectively random with respect to each other. it will also be evident to those skilled in the art that the case of N equal to 2 may be generalized to any number N, greater than 2.

Since the phase and amplitude of the carrier residues will be random, with sufficient N, when second error signal 165' and third error signal 165" are combined in the N way combiner 168, (or for larger N as the resulting error signals are combined) the carrier residues will cancel one another, resulting in an overall lowered carrier residue in combined error signal 1050'.

This can be seen in the first embodiment with reference to FIG. 11, in which second carrier residue vector 304' is added to third carrier residue vector 304" yielding fourth carrier residue vector 306. Since second carrier residue vector 304' and third carrier residue vector 304' are independent, and therefore effectively random in relation to each other, the magnitude of the resulting fourth carrier residue vector 306 will vary randomly between the scalar addition of the magnitudes of second carrier residue vector 304' and third carrier residue 304" (when the vectors are in phase) to approaching zero (as the vectors approach equal amplitude and exactly 180 degrees out of phase).

Combined error signal 1050' output from the N way combiner 168 should therefore have a lower carrier residue component than first error signal 1050 output from first carrier cancellation coupler 16, and when combined error signal 1050' is input to error amplifier 17, yielding second amplified error signal 1051' which is input to first distortion cancellation coupler 18, the use of the invention will result in a second output signal 1060' with less distortion than output signal 1060.

It will be evident to those skilled in the art that the described embodiment, in which N is 2, may be generalized using any number N (greater than 1) of N cancellation couplers 164 connected in parallel to each of the first N way divider 162 and the second N way divider 166 to divide the signal N ways, and an N way combiner 168 to combine the N coupled signals, the output of each of the N cancellation couplers 164 connected to the N way combiner 168.

In a preferred embodiment, the components of N way cancellation circuit 160 are individually selected to complement one another during manufacture, resulting in a minimal fourth carrier residue vector 306.

If all the carrier residue vectors are in phase at the output of the N way combiner, the resulting combined carrier power remaining after N way carrier cancellation is given by the formula:

$$P=(V+\ldots+V)^2/R=N^2V^2/R \quad \text{(Eq. 1)}$$

In other words, $P_{in\text{-}phase}$ is equal to P without N way carrier cancellation.

If the phases of the carrier residue vectors are completely random at the output of the N way combiner, the resulting combined carrier power is given by the formula:

$$P=V^2/R+\ldots+V^2/R=NV^2/R \quad \text{(Eq. 2)}$$

As will be clear to those skilled in the art, as the phase difference between pairs of carrier residue vectors approaches 180 degrees at the output of the N way combiner, the resulting combined carrier power will approach zero.

The combined carrier power remaining after N way carrier cancellation will therefore range between zero and $P_{in\text{-}phase}$, and on average will be $P_{random}$. The carrier suppression may be calculated as the percentage change from the in phase state, $\Delta P/P_{in\text{-}phase}$, which on average will yield:

[0075] $\Delta P/P_{in\text{-}phase} = \left(P_{in\text{-}phase} - P_{random}\right)/P_{in\text{-}phase}$ (Eq. 3)

[0076] $\Delta P/P_{in\text{-}phase} = 1 - \left(P_{random}/P_{in\text{-}phase}\right)$ (Eq. 4)

[0077] $\Delta P/P = 1 - (NV^2/R)/(N^2V^2/R)$ (Eq. 5)

[0078] $\Delta P/P_{in\text{-}phase} = 1 - (1/N)$ (Eq. 6)

Therefore, using the invention the carriers are suppressed by $[1-(1/N)]$ percent, which is to say by a factor of N, where N is the number of divided signals. For example, when N is 2, carriers are suppressed on average by a factor of 2, or 50%, and when N is 4, carriers are suppressed on average by a factor of 4, or 75%.

M Way Distortion Cancellation

In a second embodiment of the invention, first distortion cancellation coupler 18 is replaced with an M way distortion cancellation circuit 180, comprising a plurality of cancellation couplers, two signal dividers and a signal combiner, wherein the input of each cancellation coupler is connected in parallel to each of the signal dividers, the output of each cancellation coupler is connected to the signal combiner, and the reduction of distortion is accomplished by random phase cancellation. Additional components could be added to M way distortion cancellation circuit 180 without deviating from the present invention, so long as the reduction of distortion is accomplished by random phase cancellation.

Figure 3:
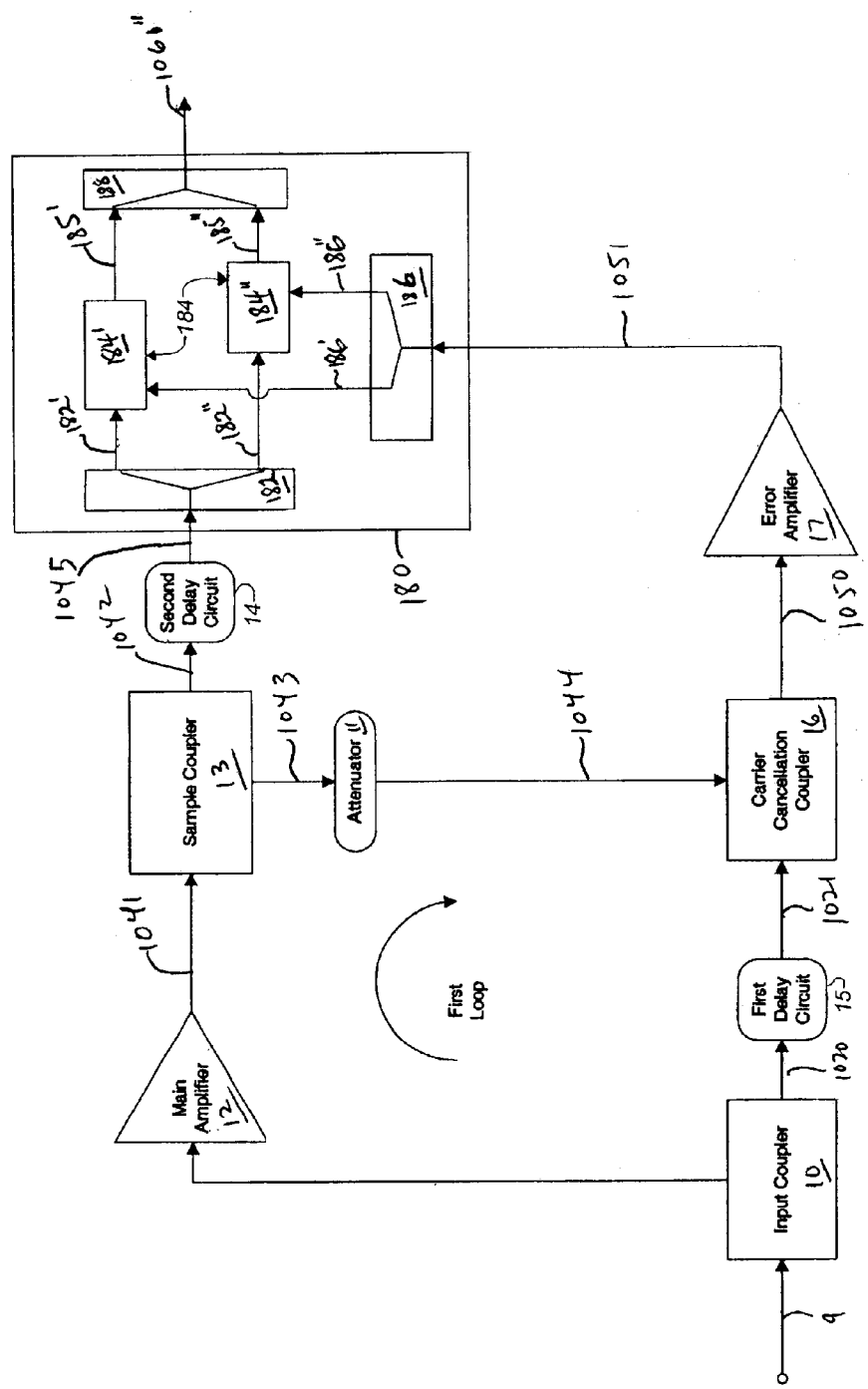
FIG. 3 is a flow diagram of the feed forward power amplifier circuit of FIG. 1 with M way random phase cancellation within the Second Loop stage according to another embodiment of the present invention.

With reference to FIG. 3, in a first embodiment in which M is 2, delayed signal with distortion 1045 enters M way distortion cancellation circuit 180 and is received into a first M way divider 182 which divides delayed signal with distortion 1045 into a fifth divided signal 182' having a fifth carrier component (not shown) and a fifth distortion component (not shown), which fifth divided signal 182' is injected into a second distortion cancellation coupler 184' and, a sixth divided signal 182", having a sixth carrier component (not shown) and a sixth distortion component (not shown), which sixth divided signal 182" is injected into a third distortion cancellation coupler 184".

First amplified error signal 1051 enters M way distortion cancellation circuit 180 and is received into a second M way divider 186 which divides first amplified error signal 1051 into a first divided error signal 186' which is injected into the second distortion cancellation coupler 184' and a second divided error signal 186''' which is injected into the third distortion cancellation coupler 184".

First divided error signal 186' combines with the fifth divided signal 182' in the second distortion cancellation coupler 184', which outputs second main signal 185' having a carrier component (not shown) and a distortion residue component which may be represented by second distortion residue vector 404', and second divided error signal 186''' combines with the sixth divided signal 182" in the third distortion cancellation coupler 184", which outputs third main signal 185" having a carrier component (not shown) and a distortion residue component which may be represented by third distortion residue vector 404".

In similar fashion to the descriptions given above, first divided error signal 186' and the fifth distortion component of the fifth divided signal 182' are approximately 180 degrees out of phase and of approximately equal amplitude, thereby substantially canceling each other, yet resulting in a distortion residue component represented by second distortion residue vector 404' of some magnitude and phase.

Likewise, second divided error signal 186''' and the sixth distortion component of the sixth divided signal 182'' are approximately 180 degrees out of phase and of approximately equal amplitude, thereby substantially canceling each other, but yet again resulting in a distortion residue component represented by third distortion residue vector 404'' of some magnitude and phase.

Again, it will be evident to those skilled in the art that the closer in amplitude and the closer to 180 degrees out of phase that first divided error signal 186' and the distortion component of the fifth divided signal 182' are, the smaller will be the distortion residue represented by second distortion residue vector 404'. The same holds for second divided error signal 186''' and the distortion component of the sixth divided signal 182''. In other words, the smaller are second distortion residue vector 404' and third distortion residue vector 404'', the more distortion will have been cancelled from second main signal 185' and third main signal 185''.

Second main signal 185' and third main signal 185'' are both input to M way combiner 188, where they are coupled into second output signal 1060'.

The amount of the distortion residue that remains in the second main signal 185' and third main signal 185'' will depend upon the physical component characteristics of the individual cancellation couplers, as will be evident to those skilled in the art. The phase and amplitude of the second distortion residue vector 404' and the third distortion residue vector 404'' will therefore be independent, and effectively random with respect to each other. It will also be evident to those skilled in the art that the case of M equal to 2 may be generalized to any number M, greater than 2.

As was the case with N way carrier cancellation, since the phase and amplitude of the distortion residues will be random, with sufficient M, when second main signal 185' and third main signal 185'' are combined in the M way combiner 188, (or for larger M as the resulting signals are combined) the distortion residues will cancel one another, resulting in an overall lowered distortion residue in second output signal 1060'.

This can be seen in the first embodiment with reference to FIG. 12, in which second distortion residue vector 404' is added to third distortion residue vector 404'' yielding fourth distortion residue vector 406. Since these vectors are independent, and therefore effectively random in relation to each other, the magnitude of the resulting fourth distortion residue vector 406 will vary randomly between the scalar addition of the magnitudes of second distortion residue vector 404' and third distortion residue 404'' (when the vectors are in phase) to approaching zero (as the vectors approach equal amplitude and exactly 180 degrees out of phase).

Third output signal 1060'' output from the M way combiner 188 should therefore have a lower distortion residue component than first output signal 1060 output from first distortion cancellation coupler 18.

Figure 4:
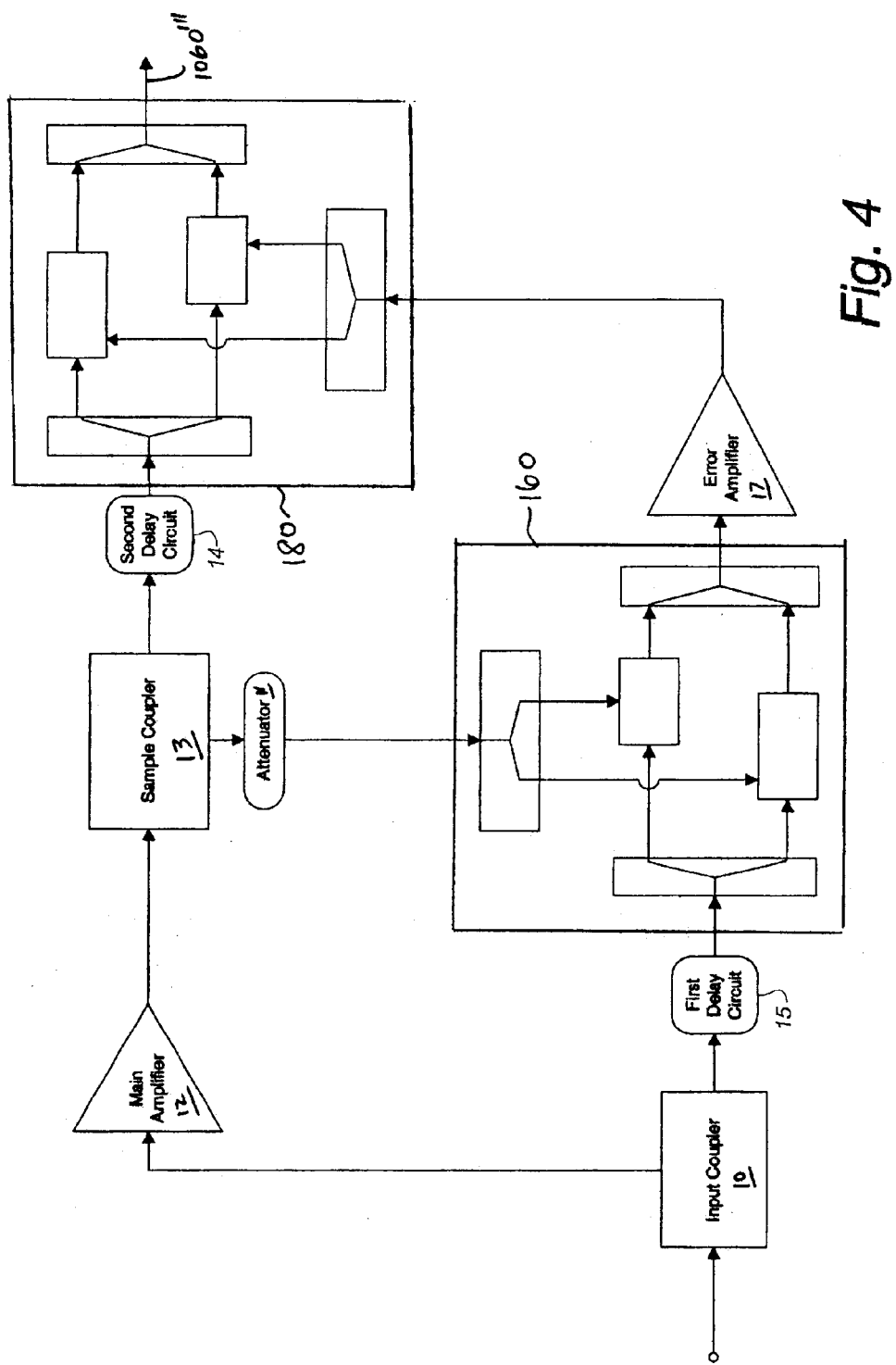
FIG. 4 is a flow diagram of the feed forward power amplifier circuit of FIG. 1 with the N way random phase cancellation of the power amplifier circuit of FIG. 2, and the M way random phase cancellation of the power amplifier circuit of FIG. 3.

As shown in FIG. 4, it is possible to combine the N way carrier cancellation with M way distortion cancellation, using second amplified error signal 1051' from N way carrier cancellation circuit 160 as input to M way distortion cancellation circuit 180.

It will be evident to those skilled in the art that the described embodiment, in which M is 2, may be generalized using any number M (greater than 1) of M distortion cancellation couplers 184 connected in parallel to each of the first M way divider 182 and the second M way divider 186, and an M way combiner 188 to combine the M coupled signals, the output of each of the M distortion cancellation couplers 184 connected to the M way combiner 188.

Having thus described the invention, it should be apparent that numerous structural modifications and adaptations may be resorted to without departing from the scope and fair meaning of the instant invention as set forth herein above and as described herein below by the claims.

What is claimed is:

1. A method for reducing the carrier component of a signal in the first loop stage of a feed forward power amplifier, comprising the steps of:
    a) dividing the signal N ways, N being greater than 1, to produce N divided signals;
    b) dividing a delayed form of the signal N ways to produce N delayed signals;
    c) coupling one of the N divided signals and one of the N delayed signals to produce one of N error signals;
    d) repeating step c) until each one of the N divided signals has been coupled with one of the N delayed signals to produce one of N error signals; and
    e) combining each of the N error signals to produce a combined error signal from a combined form of the N error signals.

2. The method of claim 1 further comprising the step of selecting the components used in coupling step c) to complement one another during manufacture.

3. A method for reducing the distortion component of a signal in the second loop stage of a feed forward power amplifier, comprising the steps of:
    a) dividing the distortion component of the signal M ways, M being greater than 1, to produce M divided error signals;
    b) dividing a delayed form of the signal M ways to produce M divided signals;
    c) coupling one of the M divided error signals and one of the M divided signals to produce one of M main signals;
    d) repeating step c) until each one of the M divided error signals has been coupled with one of the M divided signals to produce one of M main signals; and
    e) combining each of the M main signals to produce an output signal from a combined form of the M main signals.

4. The method of claim 3 further comprising the step of selecting the components used in coupling step c) to complement one another during manufacture.

5. A feed forward power amplifier comprising:
    an input coupler for receiving an input signal and dividing it in to a main signal and a first signal;
    a main amplifier connected to the input coupler for receiving the main signal and outputting a distorted amplified signal;
    a first delay circuit connected to the input coupler for receiving the first signal and outputting a first delayed signal;
    a sample coupler connected to the main amplifier for receiving the distorted amplified signal and dividing it into a first divided signal and a second divided signal;
    an attenuator connected to the sample coupler for receiving the second divided signal and outputting an attenuated signal with distortion;

an N way carrier cancellation circuit connected to the attenuator for receiving the attenuated signal with distortion and the first delay circuit for receiving the first delayed signal, and outputting a combined error signal;

an error amplifier connected to the N way carrier cancellation circuit for receiving the combined error signal and outputting an amplified error signal;

a second delay circuit connected to the sample coupler for receiving the first divided signal and outputting a delayed signal with distortion; and an M way distortion cancellation circuit connected to the second delay circuit for receiving the delayed signal with distortion and the error amplifier for receiving the amplified error signal, and outputting the output signal;

wherein either N is greater than 1 and M is 1, N is 1 and M is greater than 1, or N is greater than 1 and M is greater than 1.

6. The feed forward power amplifier of claim 5 wherein either the N way carrier cancellation circuit, or the M way distortion cancellation circuit, or both the N way carrier cancellation circuit and the M way distortion cancellation circuit, comprises a plurality of cancellation couplers, two signal dividers and a signal combiner, the input of each of the plurality of cancellation couplers connected in parallel to each of the signal dividers, and the output of each of the plurality of cancellation couplers connected to the signal combiner.

7. A feed forward power amplifier for reducing distortion in an output signal, comprising:

a) means for receiving an input signal and dividing it into a main signal and a first signal;

b) means for amplifying the main signal and outputting a distorted amplified signal;

c) means for processing the first signal to produce a first delayed signal;

d) means for dividing the distorted amplified signal into a first divided signal and a second divided signal;

e) means for attenuating the second divided signal to produce an attenuated signal with distortion;

f) means for splitting N ways both the attenuated signal with distortion and the first delayed signal and combining the split signals into a combined error signal;

g) means for amplifying the combined error signal to produce an amplified error signal;

h) means for processing the first divided signal to produce a delayed signal with distortion; and i) means for splitting M ways both the delayed signal with distortion and the amplified error signal and combining to produce the output signal;

wherein either N is greater than 1 and M is 1, N is 1 and M is greater than 1, or N is greater than 1 and M is greater than 1.

8. A method for reducing distortion in an output signal from a feed forward power amplifier, comprising the steps of:

a) receiving an input signal and dividing it into a main signal and a first signal;

b) amplifying the main signal and outputting a distorted amplified signal;

c) processing the first signal to produce a first delayed signal;

d) dividing the distorted amplified signal into a first divided signal and a second divided signal;

e) attenuating the second divided signal to produce an attenuated signal with distortion;

f) splitting N ways both the attenuated signal with distortion and the first delayed signal and combining the split signals into a combined error signal;

g) amplifying the combined error signal to produce an amplified error signal;

h) processing the first divided signal to produce a delayed signal with distortion; and i) splitting M ways both the delayed signal with distortion and the amplified error signal and combining to produce an output signal;

wherein either N is greater than 1 and M is 1, N is 1 and M is greater than 1, or N is greater than 1 and M is greater than 1.

9. The method of claim 8 further comprising the step of selecting the components used in splitting step f to complement one another during manufacture.

10. The method of claim 8 further comprising the step of selecting the components used in splitting step i to complement one another during manufacture.

* * * * *

UNITED STATES PATENT AND TRADEMARK OFFICE
CERTIFICATE OF CORRECTION

PATENT NO.    : 6,420,929 B1
DATED         : July 16, 2002
INVENTOR(S)   : Thomas Ha It is certified that error appears in the above-identified patent and that said Letters Patent is hereby corrected as shown below:

Column 9,
Line 56, delete Eq. 1, and substitute:

$$P_{\text{in-phase}} = (V_1 + \ldots + V_n)^2/R = N^2 V_1^2/R$$

Line 63, delete Eq. 2, and substitute:

$$P_{\text{random}} = V_1^2/R + \ldots + V_n^2/R = N V_1^2/R$$

Column 10,
Line 7, Eq. 3, delete "[0075]".
Line 9, Eq. 4, delete "[0076]".
Line 12, delete Eq. 5, and substitute:

$$\Delta P/P_{\text{in-phase}} = 1 - (N V_1^2/R)/(N^2 V_1^2/R)$$

Line 13, Eq. 6, delete "[0078]".

Signed and Sealed this

Twenty-eighth Day of January, 2003

JAMES E. ROGAN
*Director of the United States Patent and Trademark Office*